(12) United States Patent
Zhang

(10) Patent No.: US 10,879,490 B2
(45) Date of Patent: Dec. 29, 2020

(54) DISPLAY PANEL AND DISPLAY DEVICE INCLUDING AN UNEVEN STRUCTURE ON A BARRIER

(71) Applicant: Xiamen Tianma Micro-Electronics Co., Ltd, Xiamen (CN)

(72) Inventor: Peng Zhang, Xiamen (CN)

(73) Assignee: XIAMEN TIANMA MICRO-ELECTRONICS CO., LTD., Xiamen (CN)

( * ) Notice: Subject to any disclaimer, the term of this patent is extended or adjusted under 35 U.S.C. 154(b) by 0 days.

(21) Appl. No.: 16/455,535

(22) Filed: Jun. 27, 2019

(65) Prior Publication Data

US 2020/0212354 A1 Jul. 2, 2020

(30) Foreign Application Priority Data

Dec. 29, 2018 (CN) .......................... 2018 1 1653006

(51) Int. Cl.
*H01L 51/52* (2006.01)
*H01L 27/32* (2006.01)

(52) U.S. Cl.
CPC ...... *H01L 51/5253* (2013.01); *H01L 27/3246* (2013.01); *H01L 27/3258* (2013.01)

(58) Field of Classification Search
CPC . H01L 51/50–56; H01L 51/0032–0095; H01L 51/5253; H01L 27/3246; H01L 27/3258; H01L 2251/50–568; H01L 51/524; H01L 51/5044; H01L 51/5237; H01L 51/5243; H01L 27/3276; H01L 27/3244; H01L 27/3283
See application file for complete search history.

(56) References Cited

U.S. PATENT DOCUMENTS

| | | | | |
|---|---|---|---|---|
| 2017/0125734 A1* | 5/2017 | Lee | ..................... | H01L 51/0097 |
| 2017/0141352 A1* | 5/2017 | Shin | ..................... | G02F 1/13394 |
| 2017/0149017 A1* | 5/2017 | Lee | ..................... | H01L 27/3246 |
| 2018/0061728 A1* | 3/2018 | Chen | .................... | H01L 27/1248 |
| 2018/0097200 A1* | 4/2018 | Park | ..................... | H01L 51/5253 |
| 2019/0207157 A1* | 7/2019 | Gong | ................... | H01L 27/3246 |
| 2020/0067015 A1* | 2/2020 | Jin | ....................... | H01L 51/5246 |

FOREIGN PATENT DOCUMENTS

| | | |
|---|---|---|
| CN | 104425760 A | 3/2015 |
| CN | 106847858 A | 6/2017 |
| CN | 107968111 A | 4/2018 |
| CN | 207441754 U | 6/2018 |
| CN | 108832022 A | 11/2018 |
| CN | 109065749 A | 12/2018 |

OTHER PUBLICATIONS

CN Office Action, dated Aug. 4, 2020.

* cited by examiner

*Primary Examiner* — Khiem D Nguyen

(74) *Attorney, Agent, or Firm* — Alston & Bird LLP

(57) ABSTRACT

The present disclosure provides a display panel and a display device. The display panel includes: a base; a barrier, located on a side of the base and surrounding a display area of the display panel; and an encapsulation layer, located on a side of the barrier facing away from the base. An uneven structure is formed on a surface of the barrier in contact with the encapsulation layer.

14 Claims, 7 Drawing Sheets

DISPLAY PANEL AND DISPLAY DEVICE INCLUDING AN UNEVEN STRUCTURE ON A BARRIER

CROSS-REFERENCE TO RELATED APPLICATIONS

The present application claims priority to Chinese Patent Application No. CN201811653006.3, filed on Dec. 29, 2018, the content of which is incorporated herein by reference in its entirety.

TECHNICAL FIELD

The present disclosure relates to the field of display technologies, and in particular, to a display panel and a display device.

BACKGROUND

An Organic Light-Emitting Diode (OLED) display panel is widely used in the field of display technologies due to its advantages such as autonomous light-emitting, high contrast ratio, no viewing angle limitation, flexible displaying, etc. At present, in order to improve the water and oxygen resistance property of each OLED device in a flexible OLED display panel, a thin film encapsulation (TFE) is usually adopted. That is, an encapsulation layer is provided as an inorganic layer and an organic layer that are stacked, so as to encapsulate the OLED display panel. However, in the existing OLED display panel, a bonding between the encapsulation layer and a barrier for limiting a boundary of the organic layer of the encapsulation layer is poor, and thus the encapsulation layer easily peels off from the barrier. This may form a passage for introducing the outside water and oxygen, thereby causing failure in encapsulation of an edge of a display area.

SUMMARY

In view of this, the present disclosure provides a display panel and a display device, aiming to solve the problem in the related art that the encapsulation layer easily peels off from the barrier.

In an aspect, the present disclosure provides a display panel, including: a base; a barrier, located on a side of the base and surrounding a display area of the display panel; and an encapsulation layer, located on a side of the barrier facing away from the base. An uneven structure is formed on a surface of the barrier in contact with the encapsulation layer.

In another aspect, the present disclosure provides a display device including the display panel described above.

BRIEF DESCRIPTION OF DRAWINGS

In order to more clearly illustrate technical solutions in embodiments of the present disclosure, the accompanying drawings used in the embodiments are briefly introduced as follows. It should be noted that the drawings described as follows are merely part of the embodiments of the present disclosure, other drawings can also be acquired by those skilled in the art without paying creative efforts.

DESCRIPTION OF EMBODIMENTS

For better illustrating technical solutions of the present disclosure, embodiments of the present disclosure will be described in detail as follows with reference to the accompanying drawings.

It should be noted that, the described embodiments are merely exemplary embodiments of the present disclosure, which shall not be interpreted as providing limitations to the present disclosure. All other embodiments obtained by those skilled in the art without creative efforts according to the embodiments of the present disclosure are within the scope of the present disclosure.

The terms used in the embodiments of the present disclosure are merely for the purpose of describing particular embodiments but not intended to limit the present disclosure. Unless otherwise noted in the context, the singular form expressions "a", "an", "the" and "said" used in the embodiments and appended claims of the present disclosure are also intended to represent plural form expressions thereof.

It should be understood that the term "and/or" used herein is merely an association relationship describing associated objects, indicating that there may be three relationships, for example, A and/or B may indicate that three cases, i.e., A existing individually, A and B existing simultaneously, B existing individually. In addition, the character "/" herein generally indicates that the related objects before and after the character form an "or" relationship.

It should be understood that, although an edge may be described using the terms of "first", "second", "third", etc., in the embodiments of the present disclosure, the edge will not be limited to these terms. These terms are merely used to distinguish edges from one another. For example, without departing from the scope of the embodiments of the present disclosure, a first edge may also be referred to as a second edge, and similarly, a second edge may also be referred to as a first edge.

Figure 1:
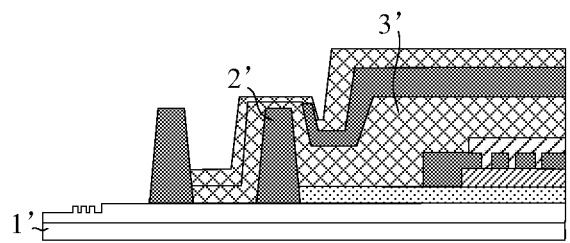
FIG. 1 is a schematic cross-sectional view of a border region of a display panel in the related art.

FIG. 1 is a schematic cross-sectional view of a border region of a display panel in the related art. As shown in FIG. 1, the display panel includes a base 1', a barrier 2' arranged on the base 1', and an encapsulation layer 3' in direct contact with the barrier 2'. However, the display panel with such a structure is prone to encapsulation failure. The inventor has found through research that since a contact surface of the barrier 2' and the encapsulation layer 3' is extremely smooth, the barrier portion 2' easily peels off from the encapsulation layer 3' at an interface therebetween after the display panel is bent. A space formed by this peeling may form a passage for introducing the outside water and oxygen, thereby causing encapsulation failure.

Figure 2:
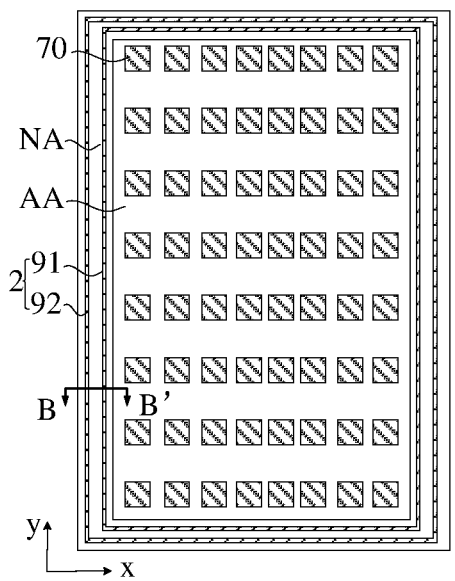
FIG. 2 is a top view of a display panel according to an embodiment of the present disclosure.
Figure 3:
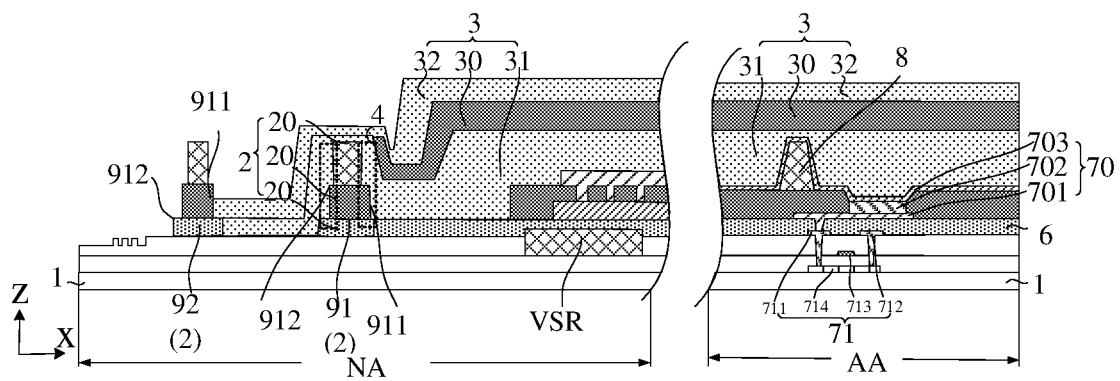
FIG. 3 is a schematic cross-sectional view along line BB' of FIG. 2.

In view of this, an embodiment of the present disclosure provides a display panel. FIG. 2 is a top view of a display panel according to an embodiment of the present disclosure, and FIG. 3 is a schematic cross-sectional view along line BB' of FIG. 2. As shown in FIG. 2 and FIG. 3, a direction x and a direction y are in a plane of the display panel, and a direction z is perpendicular to the plane of the display panel. The display panel includes: a base 1, a barrier 2, and an encapsulation layer 3. As shown in FIG. 2, the barrier 2 surrounds a display area AA of the display panel. As shown in FIG. 3, the barrier 2 is located on one side of the base 1, and the encapsulation layer 3 is located on a side of the barrier 2 facing away from the base 1. An uneven structure 4 is formed on a contact surface between the barrier 2 and the encapsulation layer 3.

In the display panel provided by this embodiment of the present disclosure, the uneven structure 4 is formed on the contact surface between the barrier 2 and the encapsulation layer 3, that is, the contact surface between the barrier 2 and the encapsulation layer 3 is a non-flat surface, so that the contact surface between the barrier 2 and the encapsulation layer 3 can have a larger roughness compared with the related art. In this way, the uneven structure 4 can prevent a relative displacement between the encapsulation layer 3 and the barrier 2 when the display panel is bent. In this way, a bonding force between the barrier 2 and the encapsulation layer 3 is increased, and thus a possibility of the encapsulation layer 3 peeling off from the barrier 2 under an external force is reduced. Moreover, even if a crack is caused due to the relative displacement between the encapsulation layer 3 and the barrier 2 occurs under an external force, the uneven structure 4 can prevent the crack from extending, thereby reducing a possibility of forming a crack between the barrier 2 and the encapsulation layer 3, which would otherwise allow the outside water and oxygen to be introduced into the display panel. In this way, the encapsulation reliability of the display panel can be improved.

Figure 4:
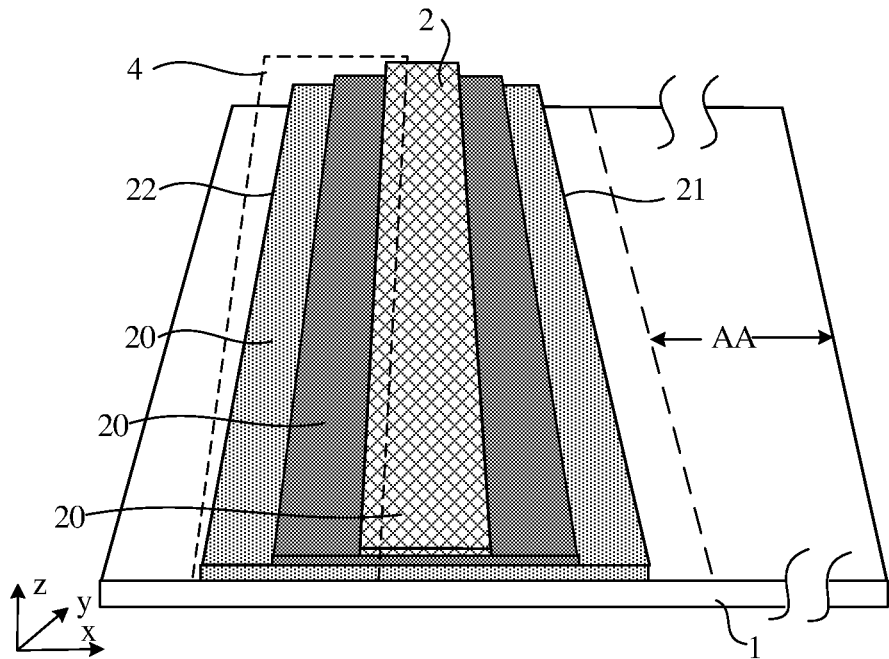
FIG. 4 is a perspective view of a portion of a barrier located in a left border of a display panel according to an embodiment of the present disclosure.

FIG. 4 is a perspective view of a portion of a barrier located in a left border of a display panel according to an embodiment of the present disclosure. In an example, as shown in FIG. 3 and FIG. 4, the barrier 2 includes at least two organic layers 20 stacked together. The respective edges of two adjacent organic layers 20 are mutually staggered such that the abovementioned uneven structure 4 can be formed on a contact surface between the barrier 2 formed by the stacked at least two organic layers 20 and the encapsulation layer 3, thereby preventing a possible relative displacement between the encapsulation layer 3 and the barrier 2 through the uneven structure 4. In this way, the encapsulation reliability of the display panel can be improved.

The barrier 2 includes three organic layers 20 in accompanying drawings of the present disclosure by way of an example, however, it should be noted that the barrier 2 may also include two organic layers 20 or more than three organic layers 20, as long as the respective edges of two adjacent organic layers 20 are mutually staggered so as to form the abovementioned uneven structure 4, which is not limited herein by the embodiments of the present disclosure.

As shown in FIG. 2 and FIG. 4, the barrier 2 located in the left border of the display panel extends along the direction y. The barrier 2 has a first edge 21 and a second edge 22 that are opposite to each other. The first edge 21 and the second edge 22 are arranged in the direction x. The direction x is perpendicular to the direction y along which the barrier 2 extends at this position. The first edge 21 is close to the display area AA, and the second edge 22 is away from the display area AA.

In a plane parallel to the base 1, the respective first edges 21 of two adjacent organic layers 20 are mutually staggered, and the respective second edges 22 of two adjacent organic layers 20 are mutually staggered, such that the abovementioned uneven structure 4 can be formed both at a side of the barrier 2 close to the display area AA and at a side of the barrier 2 away from the display area AA. In this way, a surface of the barrier 2 close to the display area AA and in contact with the encapsulation layer 3 and a surface of the barrier 2 away from the display area AA and in contact with the encapsulation layer 3 may not easily peel off from the encapsulation layer 3. Therefore, the encapsulation reliability of the display panel can be further improved.

It should be understood that, the structure of the barrier 2 is described in FIG. 4 by taking the barrier 2 located in the left border of the display panel as an example. However, as shown in FIG. 2, the barrier 2 surrounds the display area AA of the display panel, and therefore the barrier 2 can extend in the direction x at upper and lower borders of the display panel, and respective first edges 21 and second edges 22 of two adjacent organic layers 20 at the corresponding positions can be staggered along the direction y. The structure is similar to that shown in FIG. 4, and details thereof will not be described herein by the embodiments of the present disclosure.

Figure 5:
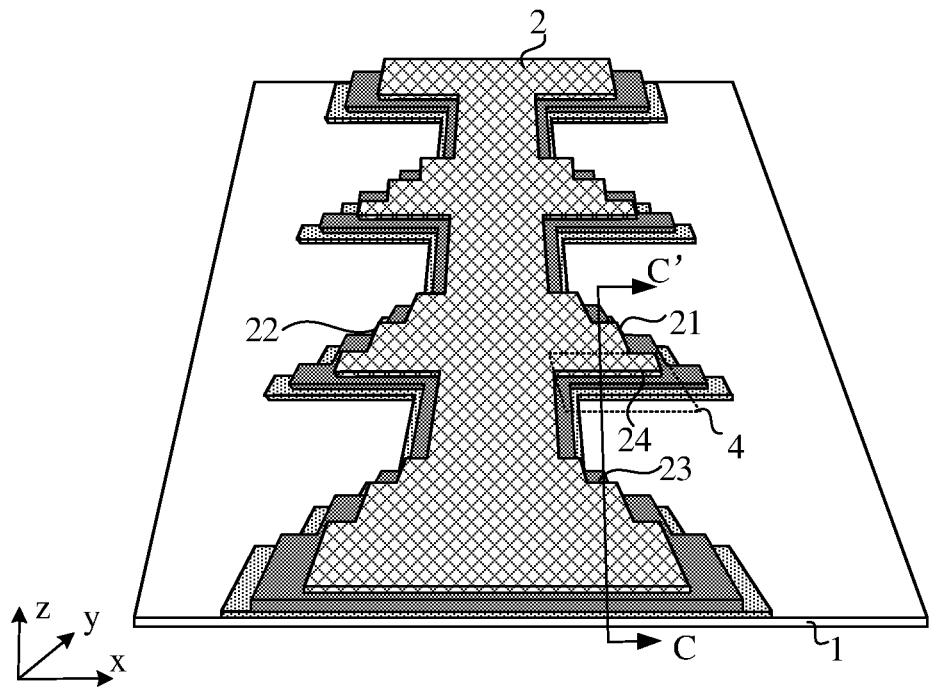
FIG. 5 is another perspective view of a portion of a barrier located in a left border of a display panel according to an embodiment of the present disclosure.
Figure 6:
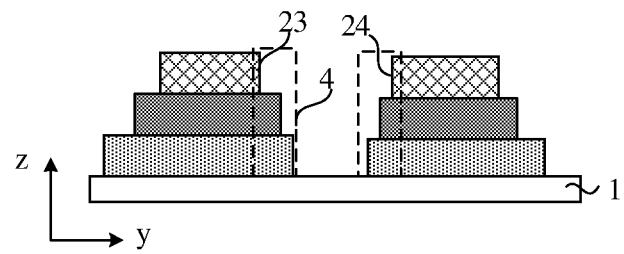
FIG. 6 is a schematic cross-sectional view along line CC' of FIG. 5.

FIG. 5 is another perspective view of a portion of a barrier located in a left border of a display panel according to an embodiment of the present disclosure, and FIG. 6 is a schematic cross-sectional view along line CC' of FIG. 5. In an embodiment, as shown in FIG. 5 and FIG. 6, the barrier 2 further includes a third edge 23 and a fourth edge 24 opposite to each other. The third edge 23 and the fourth edge 24 are arranged in the direction y along which the barrier 2 extends.

In a plane parallel to the base 1, the respective third edges 23 of two adjacent organic layers 20 are mutually staggered, and the respective fourth edges 24 of two adjacent organic layers 20 are mutually staggered, so that the abovementioned uneven structure 4 can also be formed in the direction y along which the barrier 2 extends. In this embodiment of the present disclosure, on the basis of forming the uneven structure 4 shown in FIG. 4, the respective third edges 23 and the respective fourth edges 24 arranged in the direction y in the barrier 2 can also be staggered to form the abovementioned uneven structure 4. In this way, a possibility of the encapsulation layer 3 peeling off from the barrier 2 can be further reduced, and thus the encapsulation reliability of the display panel can be improved. Moreover, when an organic encapsulation layer of the encapsulation layer 3 is manufactured in subsequently forming the encapsulation layer 3, the abovementioned uneven structure 4 formed by the third edges 23 and the fourth edges 24 can drain the organic encapsulation layer along the direction y. In this way, the organic encapsulation layer of the encapsulation layer 3 can be limited between the barrier 2 and the display area AA, thereby preventing the organic encapsulation layer from extending outward beyond the barrier 2 and thus improving the encapsulation quality.

Figure 7:
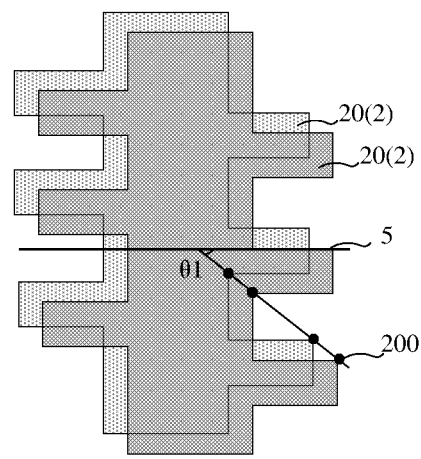
FIG. 7 is a schematic top view of two adjacent organic layers of a barrier according to an embodiment of the present disclosure.

FIG. 7 is a schematic top view of two adjacent organic layers of a barrier according to an embodiment of the present disclosure. In an example, as shown in FIG. 7, the barrier 2 includes a bending axis 5. The barrier 2 can be bent with respect to the bending axis 5. A projection of the organic layer 20 on the plane of the base 1 includes a plurality of inflection points 200. As shown in FIG. 7, in the projections of the two adjacent organic layers 20 on the plane of the base 1, an included angle θ1 between a line connecting two adjacent inflection points 200 and the bending axis 5 satisfies $0 \leq \theta 1 < 90°$. The barrier 2 is subjected to a large stress at a position of the inflection point 200 when being bent, and a film layer where the bending axis 5 is located is also subjected to a large stress when being bent. Alternatively, the line connecting a plurality of different positions in the barrier 2 may be set to be perpendicular to the bending axis 5, such that a resistance to bending of the barrier 2 can be improved to some extent when the barrier 2 is bent with respect to the bending axis 5.

In an embodiment, projections of the organic layers 20 constituting the barrier 2 on the plane of the base 1 may have any one or more shapes of a zigzag shape, a wave shape, and a fish bone shape, so that the abovementioned uneven structure 4 can be formed at the contact surface between the barrier 2 and the encapsulation layer 3 by staking a plurality of organic layers 20. The shape of the organic layer 20 can be selected according to actual process conditions while ensuring the encapsulation reliability of the display panel. In this way, a design of the display panel can be adapted to various different process conditions, thereby increasing flexibility in the manufacturing process of the barrier 2.

Figure 8:
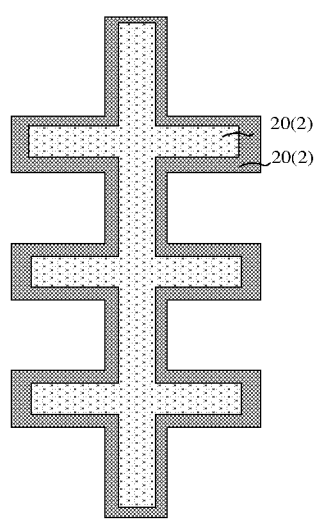
FIG. 8 is another schematic top view of two adjacent organic layers of a barrier according to an embodiment of the present disclosure.

FIG. 8 is another schematic top view of two adjacent organic layers of a barrier according to an embodiment of the present disclosure. In an example, as shown in FIG. 8, projections of two adjacent organic layers 20 on the plane of the base 1 have a same shape and different areas. In this way, the abovementioned uneven structure can be formed on the contact surface between the barrier 2 and the encapsulation layer 3, and in the actual manufacturing process, the two adjacent organic layers 20 can be respectively evaporated using two masks having a same shape and different areas.

Figure 9:
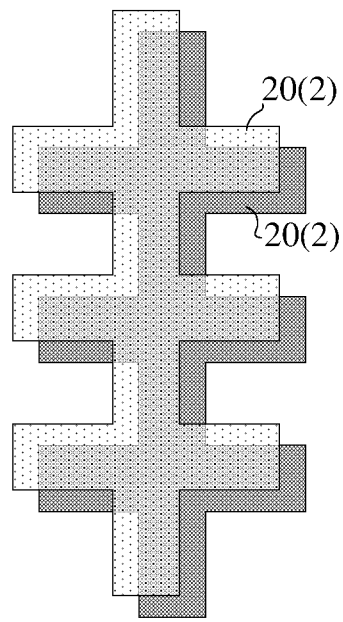
FIG. 9 is still another schematic top view of two adjacent organic layers of a barrier according to an embodiment of the present disclosure.

FIG. 9 is still another schematic top view of two adjacent organic layers of a barrier according to an embodiment of the present disclosure. In an embodiment, as shown in FIG. 9, projections of two adjacent organic layers 20 on the plane of the base 1 have a same shape and a same area. Here, the projections of the two adjacent organic layers 20 on the plane of the base 1 overlap with each other and are mutually staggered, so that the uneven structure can be formed on the contact surface between the barrier 2 formed by stacking the organic layers and the encapsulation layer 3. According to the present disclosure, adjacent organic layers 20 of the barrier 2 are set to have a same shape and a same area. Moreover, in the actual manufacturing process, each organic layer 20 of the barrier 2 can be formed using a same mask, in which it is only needed to translate the mask by a corresponding distance when manufacturing different organic layers 20. In this way, the process costs can be reduced.

Figure 10:
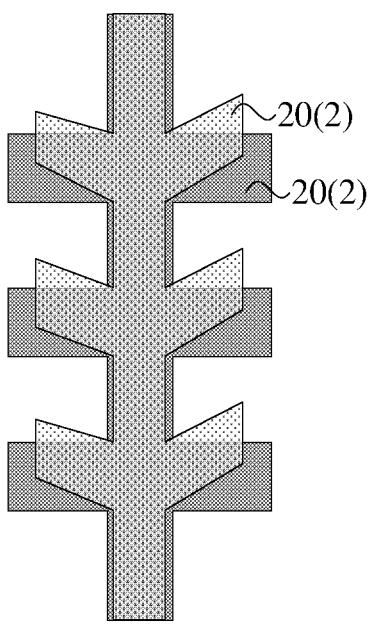
FIG. 10 is yet another schematic top view of two adjacent organic layers of a barrier according to an embodiment of the present disclosure.

FIG. 10 is yet another schematic top view of two adjacent organic layers of a barrier according to an embodiment of the present disclosure. In an embodiment, as shown in FIG. 10, projections of two adjacent organic layers 20 on the plane of the base 1 have different shapes, and it is also possible that the uneven structure is formed on the contact surface between the barrier 2 formed by stacking the organic layers and the encapsulation layer 3. In this case, the two adjacent organic layers 20 can be respectively evaporated using two masks having different shapes, so that the uneven structure is formed on the contact surface between the barrier 2 formed by the stacking organic layers 20 and the encapsulation layer 3. In this way, flexibility in the manufacturing process of the barrier 2 can be improved.

As shown in FIG. 3, the barrier 2 is located in a non-display area NA of the display panel. In the display area AA, a planarization layer 6, a pixel definition layer 7, and a support pillar 8 are stacked. The planarization layer 6 is close to the base 1, the support pillar 8 is away from the base 1, and the pixel definition layer 7 is located between the planarization layer 6 and the support pillar 8. As shown in FIG. 2 and FIG. 3, a plurality of sub-pixels 70 is further provided in the display area AA. A position of each sub-pixel 70 is defined by the abovementioned pixel definition layer 7. Each sub-pixel 70 has an anode 701, a light-emitting layer 702, and a cathode 703 that are stacked. The support pillar 8 is configured to support a mask used in an evaporation process when a film layer such as the light-emitting layer 702 of the sub-pixel 70 is formed by the evaporation process.

In an example, as shown in FIG. 3, a thin film transistor 71 for driving the sub-pixel 70 is further provided in the display area AA of the display panel. The thin film transistor 71 includes a source electrode 711, a drain electrode 712, a gate electrode 713, and an active layer 714.

With further reference to FIG. 3, the barrier 2 includes three organic layers 20 that are stacked. One organic layer 20 located close to the base 1 is disposed in a same layer as the planarization layer 6. One organic layer 20 located in the middle is disposed in a same layer as the pixel definition layer 7. One organic layer 20 located away from the base 1 is disposed in a same layer as the support pillar 8. Thus, the barrier 2 can be manufactured in same layers as the planarization layer 6, the pixel definition layer 7 and the support pillar 8 during the manufacturing, thereby simplifying the manufacturing process.

Figure 11:
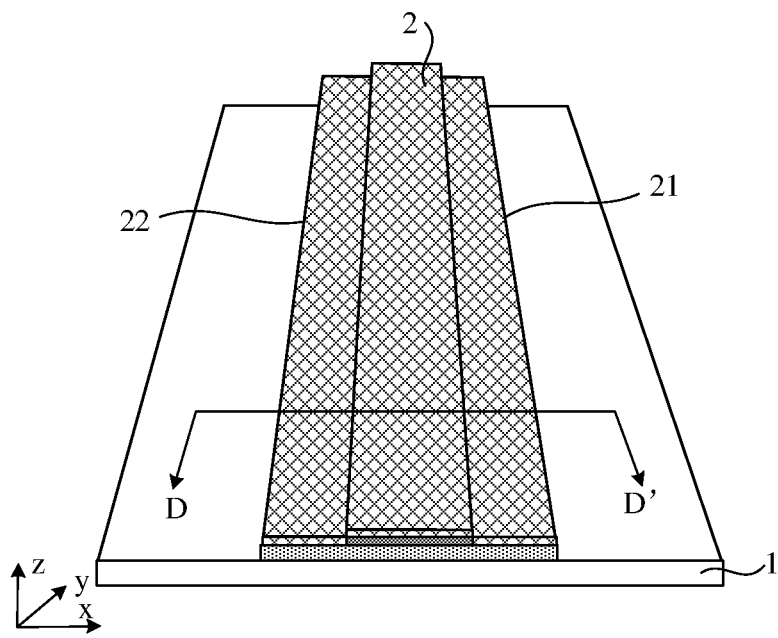
FIG. 11 is still another perspective view of a portion of a barrier located in a left border of a display panel according to an embodiment of the present disclosure.
Figure 12:
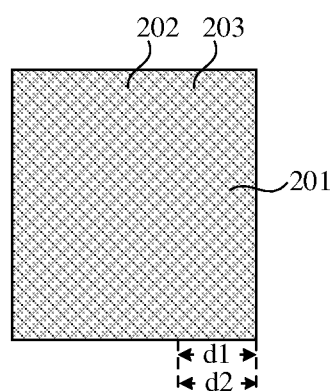
FIG. 12 is a schematic top view of FIG. 11.
Figure 13:
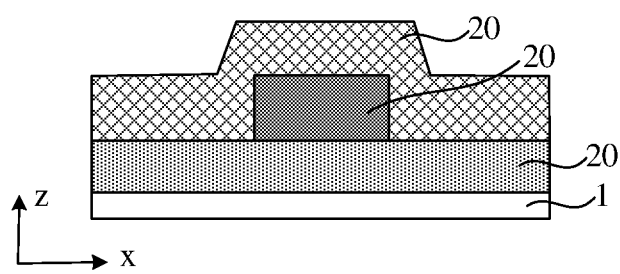
FIG. 13 is a schematic cross-sectional view along line DD' of FIG. 11.

FIG. 11 is still another perspective view of a portion of a barrier located in a left border of a display panel according to an embodiment of the present disclosure. FIG. 12 is a schematic top view of FIG. 11. FIG. 13 is a schematic cross-sectional view along line DD' of FIG. 11. In an example, as shown in FIG. 11, FIG. 12 and FIG. 13, a projection of the organic layer 20 close to the base 1 on the plane of the base 1 is referred to as a first projection 201; a projection of the organic layer 20 located in the middle on the plane of the base 1 is referred to as a second projection 202; and a projection of the organic layer 20 away from the base 1 on the plane of the base 1 is referred to as a third projection 203. In this embodiment of the present disclosure, each of the first projection 201 and the third projection 203 has an area larger than an area of the second projection 202, and each of the first projection 201 and the third projection 203 covers the second projection 202. In other words, an edge of the organic layer 20 close to the base 1 and an edge of the organic layer 20 away from the base are staggered towards a same direction with respect to an edge of the organic layer 20 located in the middle. For example, in the embodiment shown in FIG. 13, the edge of the organic layer 20 close to the base 1 and the edge of the organic layer 20 away from the base are both staggered towards a direction facing away from a center of the organic layer 20 located in the middle, with respect to the edge of the organic layer 20 located in the middle position. In this way, the organic layer 20 located in the middle can have a smallest size and the upper and lower organic layers 20 each have a larger area, so that edges of the three organic layers 20 are staggered to form an obvious uneven structure. If the sizes of the three inorganic layers 20 constituting the barrier 2 gradually increase or decrease along the direction z, edges of two adjacent organic layers 20 may be extremely close to each other to form a smooth transition when the two adjacent organic layers 20 have similar sizes. As a result, the uneven structure may not be formed on the surface of the barrier 2.

Figure 14:
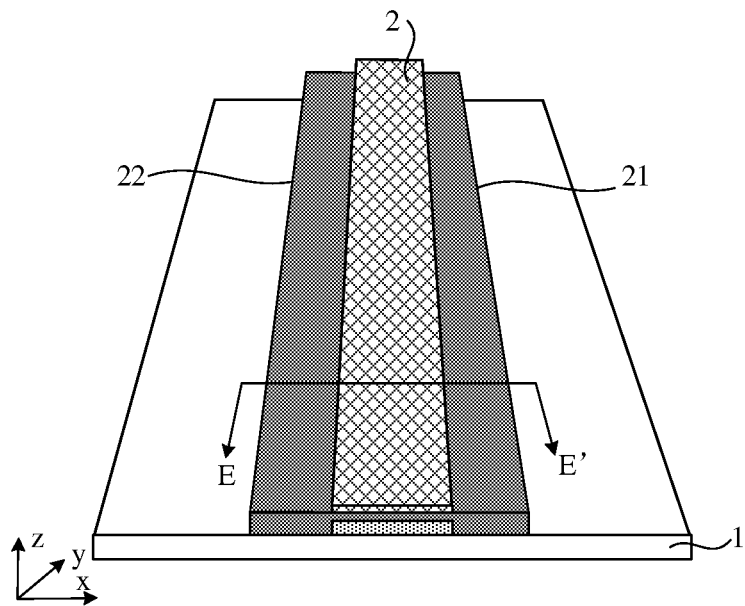
FIG. 14 is yet another perspective view of a portion of a barrier located in a left border of a display panel according to an embodiment of the present disclosure.
Figure 15:
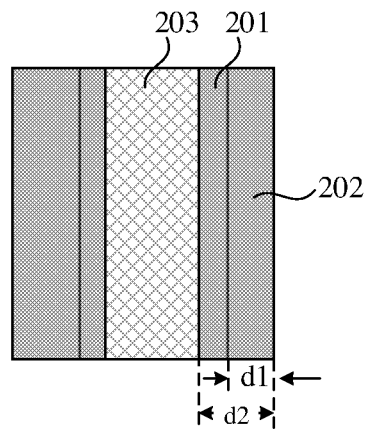
FIG. 15 is a schematic top view of FIG. 14.
Figure 16:
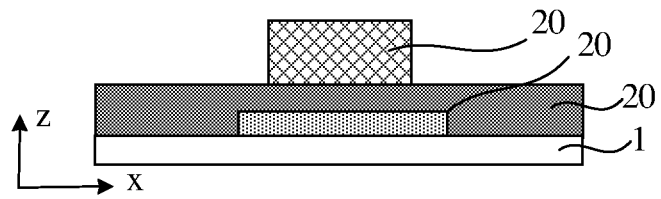
FIG. 16 is a schematic cross-sectional view along line EE' of FIG. 14.

Based on this, an embodiment of the present disclosure further provides another design. FIG. 14 is yet another perspective view of a portion of a barrier located in a left border of a display panel according to an embodiment of the present disclosure. FIG. 15 is a schematic top view of FIG. 14. FIG. 16 is a schematic cross-sectional view along line EE' of FIG. 14. As shown in FIG. 14, FIG. 15, and FIG. 16, the second projection 202 has an area larger than each of an area of the first projection 201 and an area of the third projection 203. The second projection 202 covers the first projection 201, and the second projection 202 covers the third projection 203. In other words, the edge of the organic layer 20 close to the base 1 and the edge of the organic layer 20 away from the base are staggered towards a direction facing toward the center of the organic layer 20 located in the middle, with respect to the edge of the organic layer 20 located in the middle. In this way, the edges of the three organic layers 20 are mutually staggered to form an uneven structure.

In an embodiment, as shown in FIG. 12, the shortest distance between the edge of the second projection 202 and the edge of the first projection 201 is referred to as a first distance d1, and the shortest distance between the edge of the second projection 202 at a same position and the third projection 203 is referred to as a second distance d2. Here, the first distance d1 is equal to the second distance d2. In other words, the edge of the organic layer 20 close to the base 1 and the edge of the organic layer 20 away from the base are staggered by a same distance with respect to the edge of the organic layer 20 located in the middle. That is, the organic layer 20 close to the base 1 and the organic layer 20 away from the base 1 have a same shape and area, so that the organic layer 20 close to the base 1 and the organic layer 20 away from the base can be respectively manufactured by a same mask when manufacturing the barrier 2, thereby reducing the process costs. It should be noted that as shown in FIG. 15, the first distance d1 may be not equal to the second distance d2 in the present disclosure, and the uneven structure may still be formed on the surface of the barrier 2.

In an embodiment, as shown in FIG. 2 and FIG. 3, the barrier 2 includes a first barrier portion 91 and a second barrier portion 92. The first barrier portion 91 and the second barrier portion 92 are located on a same side of the base 1. The first barrier portion 91 surrounds the display area AA of the display panel, and the second barrier portion 92 surrounds the first barrier portion 91. The encapsulation layer 3 includes a first inorganic layer 31, an organic encapsulation layer 30 and a second inorganic layer 32. The first inorganic layer is in contact with the first barrier portion 91 and the second barrier portion 92. The organic encapsulation layer 30 covers the display area AA. An edge of the organic encapsulation layer 30 is in contact with an edge of the first barrier portion 91 close to the display area AA. In this embodiment of the present disclosure, the first barrier portion 91 can prevent the organic encapsulation layer 30 from crossing beyond the first barrier portion 91, so that the organic encapsulation crossing beyond 30 is prevented from contacting the outside water and oxygen, thereby improving the encapsulation reliability of the display panel.

In an embodiment, as shown in FIG. 3, the first inorganic layer 31 and the second inorganic layer 32 of the encapsulation layer 3 may be located between the first barrier portion 91 and the second barrier portion 92. The first barrier portion 91 and the second barrier portion 92 each include a first side surface 911 and a second side surface 912 opposite to each other. Planes of the first side surface 911 and the second side surface 912 intersect with the plane of the base 1. The first side surface is close to the display area AA, and the second side surface is away from the display area AA. As shown in FIG. 3, an uneven structure 4 is formed on each of the first side surface 911 and the second side surface 912 of the first barrier portion 91, and an uneven structure 4 is formed on the first side surface 911 of the second barrier portion 92. In this way, each surface of the barrier that is in contact with the encapsulation layer 3 may not easily peel off from the encapsulation layer 3, thereby further improving the encapsulation reliability of the display panel.

Figure 17:
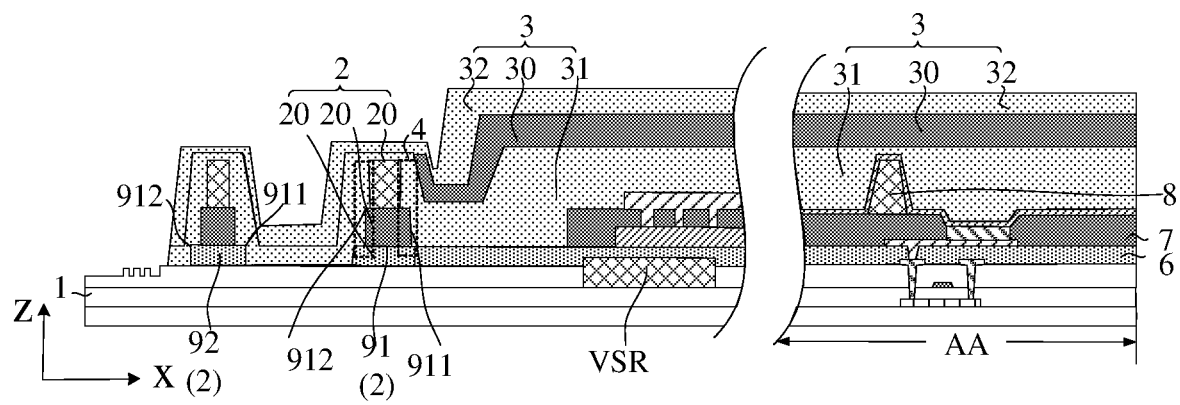
FIG. 17 is another schematic cross-sectional view along line BB' of FIG. 2.

In an embodiment, when manufacturing the first inorganic layer 31 and the second inorganic layer 32, the first inorganic layer 31 and/or the second inorganic layer 32 may extend to a side of the second barrier portion 92 facing away from the display area AA. In other words, as shown in FIG. 17, which is another schematic cross-sectional view along line BB' of FIG. 2, in this case, the encapsulation layer 3 is also provided at a side of the second barrier portion 92 facing away from the display area AA. Correspondingly, in an embodiment of the present disclosure, an uneven structure may also be formed on the second side surface 912 of the second barrier portion 92. In this way, a bonding force between the second side surface 912 of the second barrier portion 92 and the encapsulation layer 3 can also be improved when the first inorganic layer 31 and the second inorganic layer 32 extend.

Figure 18:
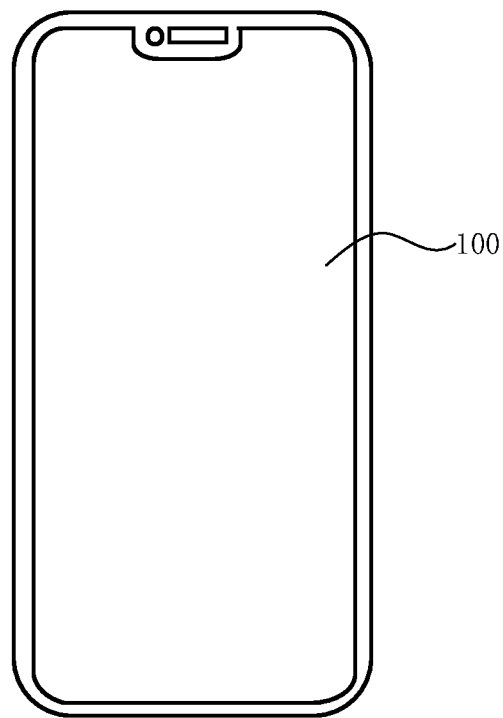
FIG. 18 is a schematic structural diagram of a display device according to an embodiment of the present disclosure.

An embodiment of the present disclosure further provides a display device. IG. 18 is a schematic structural diagram of a display device according to an embodiment of the present disclosure. As shown in FIG. 18, the display device includes the display panel 100 described above. The structure of the display panel 100 has been described in details in the above embodiments, and will not be further described herein. It should be noted that the display device shown in FIG. 18 is merely illustrative, and the display device may be any electronic device having a display function, such as a cellphone, a tablet computer, a notebook computer, an electronic paper book, or a television.

For the display device provided by this embodiment of the present disclosure, the uneven structure is formed on the contact surface between the barrier and the encapsulation layer, that is, the contact surface between the barrier and the encapsulation layer is a non-flat surface, so that the contact surface between the barrier and the encapsulation layer can have a larger roughness compared with the related art. In this way, the uneven structure can prevent a relative displacement between the encapsulation layer and the barrier when the display panel is bent. A bonding force between the barrier and the encapsulation layer can be increased, and thus a possibility of the encapsulation layer peeling off from the barrier under an external force is reduced. Moreover, even if a crack is caused due to the relative displacement between the encapsulation layer and the barrier occurs under an external force, the uneven structure can prevent the crack from extending, thereby reducing a possibility of forming a crack between the barrier and the encapsulation layer, which would otherwise allow the outside water and oxygen to be introduced into the display panel. In this way, the encapsulation reliability of the display panel can be improved.

The above-described embodiments are merely preferred embodiments of the present disclosure and are not intended to limit the present disclosure. Any modifications, equivalent substitutions and improvements made within the principle of the present disclosure shall fall into the protection scope of the present disclosure.

What is claimed is:

1. A display panel, comprising:
a base;
a barrier, located on a side of the base and surrounding a display area of the display panel; and
an encapsulation layer, located on a side of the barrier facing away from the base,
wherein an uneven structure is formed on a surface of the barrier in contact with the encapsulation layer;
wherein the barrier comprises at least two organic layers that are stacked, edges of two adjacent organic layers of the at least two organic layers are mutually staggered;
wherein each of the at least two organic layers of the barrier comprises a first edge and a second edge opposite to each other, the first edge and the second edge are arranged in a direction perpendicular to a direction along which the barrier extends; the first edge is close to the display area and the second edge is away from the display area;
wherein in a plane parallel to the base, adjacent first edges of two adjacent organic layers of the at least two organic layers of the barrier are mutually staggered and adjacent second edges of two adjacent organic layers of the at least two organic layers of the barrier are mutually staggered, so as to form the uneven structure;
wherein each of the at least two organic layers of the barrier further comprises a third edge and a fourth edge opposite to each other, the third edge and the fourth edge are arranged in the direction along which the barrier extends; in the plane parallel to the base, adjacent third edges of two adjacent organic layers of the at least two organic layers of the barrier are mutually staggered and adjacent fourth edges of two adjacent organic layers of the at least two organic layers of the barrier are mutually staggered, so as to form the uneven structure; and
wherein projections of the at least two organic layers on a plane of the base comprise a plurality of inflection points, wherein the barrier comprises a bending axis, in projections of the two adjacent organic layers on the plane of the base, an included angle $\theta 1$ between a line connecting two adjacent inflection points of the plurality of inflection points and the bending axis satisfies $0 \leq \theta 1 < 90°$.

2. The display panel according to claim 1, wherein the projections of the at least two organic layers on the plane of the base have any one or more shapes of a zigzag shape, a wave shape, and a fish bone shape.

3. The display panel according to claim 1, wherein projections of two adjacent organic layers of the at least two organic layers on a plane of the base have a same shape and different areas.

4. The display panel according to claim 1, wherein projections of two adjacent organic layers of the at least two organic layers on a plane of the base overlap with each other, have a same shape and a same area, and are mutually staggered.

5. The display panel according to claim 1, wherein projections of two adjacent organic layers of the at least two organic layers on a plane of the base have different shapes.

6. The display panel according to claim 1, wherein a planarization layer, a pixel definition layer and a support pillar are provided in the display area; the planarization layer is close to the base, the support pillar is away from the base, and the pixel definition layer is located between the planarization layer and the support pillar;
the barrier comprises three organic layers that are stacked; one of the three organic layers close to the base is disposed in a same layer as the planarization layer, one of the three organic layers located at a middle position is disposed in a same layer as the pixel definition layer, and one of the three organic layers located away from the base is disposed in a same layer as the support pillar;
a projection of the one of the three organic layers close to the base on a plane of the base is a first projection;
a projection of the one of the three organic layers located at the middle position on the plane of the base is a second projection;
a projection of the one of the three organic layers located away from the base on the plane of the base is a third projection.

7. The display panel according to claim 6, wherein each of the first projection and the third projection has a larger area than the second projection; the first projection covers the second projection; and the third projection covers the second projection.

8. The display panel according to claim 7, wherein
a shortest distance between an edge of the second projection and an edge of the first projection is a first distance,
a shortest distance between the edge of the second projection and an edge of the third projection is a second distance; and
the first distance is equal to the second distance.

9. The display panel according to claim 6, wherein the second projection has a larger area than each of the first projection and an area of the third projection; the second projection covers the first projection; and the second projection covers the third projection.

10. The display panel according to claim 9, wherein
a shortest distance between an edge of the second projection and an edge of the first projection is a first distance,
a shortest distance between the edge of the second projection and an edge of the third projection is a second distance; and
the first distance is equal to the second distance.

11. The display panel according to claim 1,
wherein the barrier comprises a first barrier portion and a second barrier portion;
wherein the first barrier portion and the second barrier portion are located on a same side of the base; wherein the first barrier portion surrounds the display area of the display panel, and the second barrier portion surrounds the first barrier portion;

wherein the encapsulation layer comprises a first inorganic layer, an organic encapsulation layer, and a second inorganic layer; the first inorganic layer is in contact with both of the first barrier portion and the second barrier portion; and wherein the organic encapsulation layer covers the display area, and an edge of the organic encapsulation layer is in contact with an edge of the first barrier portion close to the display area.

12. The display panel according to claim 11, wherein each of the first barrier portion and the second barrier portion comprises a first side surface and a second side surface opposite to each other, and a plane of the first side surface and a plane of the second side surface intersect with a plane of the base; the first side surface is close to the display area, and the second side surface is away from the display area;

the uneven structure is formed both on the first side surface of the first barrier portion and the second side surface of the first barrier portion; and the uneven structure is formed on the first side surface of the second barrier portion.

13. The display panel according to claim 12, wherein the encapsulation layer is provided on a side of the second barrier portion away from the display area;

and the uneven structure is formed on the second side surface of the second barrier portion.

14. A display device, comprising a display panel, wherein the display panel comprises:

a base;

a barrier, located on a side of the base and surrounding a display area of the display panel; and an encapsulation layer, located on a side of the barrier facing away from the base, wherein an uneven structure is formed on a surface of the barrier in contact with the encapsulation layer;

wherein the barrier comprises at least two organic layers that are stacked, edges of two adjacent organic layers of the at least two organic layers are mutually staggered;

wherein each of the at least two organic layers of the barrier comprises a first edge and a second edge opposite to each other, the first edge and the second edge are arranged in a direction perpendicular to a direction along which the barrier extends; the first edge is close to the display area and the second edge is away from the display area;

wherein in a plane parallel to the base, adjacent first edges of two adjacent organic layers of the at least two organic layers of the barrier are mutually staggered and adjacent second edges of two adjacent organic layers of the at least two organic layers of the barrier are mutually staggered, so as to form the uneven structure;

wherein each of the at least two organic layers of the barrier further comprises a third edge and a fourth edge opposite to each other, the third edge and the fourth edge are arranged in the direction along which the barrier extends; in the plane parallel to the base, adjacent third edges of two adjacent organic layers of the at least two organic layers of the barrier are mutually staggered and adjacent fourth edges of two adjacent organic layers of the at least two organic layers of the barrier are mutually staggered, so as to form the uneven structure; and wherein projections of the at least two organic layers on a plane of the base comprises a plurality of inflection points, the barrier comprises a bending axis, in projections of the two adjacent organic layers on the plane of the base, an included angle $\theta 1$ between a line connecting two adjacent inflection points of the plurality of inflection points and the bending axis satisfies $0 \leq \theta 1 < 90°$.

* * * * *